United States Patent

[11] 3,620,850

[72] Inventor Bruce E. Deal
Palo Alto, Calif.

[21] Appl. No. 20,470
[22] Filed Mar. 25, 1970
[45] Patented Nov. 16, 1971
[73] Assignee Fairchild Camera and Instrument Corporation
Syosset, L.I., N.Y.
Continuation of application Ser. No. 531,069, Mar. 2, 1966, now abandoned. This application Mar. 25, 1970, Ser. No. 020,470

[54] OXYGEN ANNEALING
8 Claims, No Drawings

[52] U.S. Cl. .......... 148/1.5, 148/33.3
[51] Int. Cl. .......... H01l 7/34
[50] Field of Search .......... 148/1.5, 181, 13, 13.1, 20.3, 33, 33.3

[56] References Cited

UNITED STATES PATENTS 3,336,661 8/1967 Polinsky .......... 148/1.5
3,384,829 5/1968 Sato .......... 148/33.3

*Primary Examiner*—Richard O. Dean
*Attorney*—Roger S. Borovay

ABSTRACT: A method for varying the surface charge density of a semiconductor device including the steps of heating the device prior to metallization at a temperature between 500° C. and 1,250° C. in dry oxygen and then cooling the device to a temperature below about 500° C. prior to the direct application of a metal layer to the device without an additional heating step.

OXYGEN ANNEALING

This is a continuation of application Ser. No. 531,069, filed Mar. 2, 1966, now abandoned.

This invention concerns a novel method for varying the surface charge density at silicon-silicon dioxide interfaces in semiconductor devices.

Semiconductor device properties are affected by surface charges in the oxide layers formed on the semiconductor. These surface charges may be impurity ions which migrate rapidly through the oxide (the charge of which is designated $Q_o$), they may be chargeable surface states or surface recombination-generation centers ($N_{st}$) or they may be fixed surface state charges ($Q_{ss}$). The latter are believed caused by stable charges or structural defects located near the semiconductor-oxide interface. While it is possible to eliminate nearly all of the charges associated with $Q_o$ and $N_{st}$ by processing conditions, the value of $Q_{ss}$ is associated with the specific method of oxide preparation and can vary over a wide range of values. Henceforth the term surface charge density will refer to the fixed surface state charge $Q_{ss}$.

In some semiconductor devices, their use or operation may be controlled by the surface charge density at the silicon-silicon dioxide interface. Therefore, control of the surface charge density will permit control of the particular device's properties. For example, the turn-on voltage of a field effect transistor or MOST device (metal-oxide-semiconductor transistor) will vary depending on the surface charge density. Thus, devices having different turn-on voltages can be achieved, if the value of $Q_{ss}$ can be varied.

In some circuits, it is necessary that matched pairs of devices be available. Therefore, a process which permits controlled variation of properties of a semiconductor device provides flexibility in producing such matched pairs of devices.

This invention provides a method for varying the surface charge density at a silicon-silicon dioxide interface of a metallized semiconductor device by heating the device prior to metallization at a temperature in the range of 500°–1250° C. in a dry oxygen ambient for a time sufficient to provide the desired surface charge density, and then cooling the device to below about 500° C. to obtain a surface charge density characteristic of the temperature at which the device was heated. At the higher temperatures, low surface charge densities are obtained and vice versa. The surface charge density thus obtained is stable under normal bias-temperature test conditions, i.e., $\pm 50V/\mu$, 10 min., 200° C. One embodiment employs rapid cooling to below 500° C., and another embodiment employs slow cooling to obtain surface charge density inversely related to temperature.

The present invention can be used with a variety of semiconductor devices, which have silicon-silicon dioxide interfaces. Field effect transistors and MOST transistors have already been mentioned. Other devices include the MOS device, which acts as a capacitor, planar transistors and diodes, etc. In planar transistors, junction characteristics such as reverse bias breakdown voltage or reverse leakage current are affected by the surface charge density near the junction. By control of $Q_{ss}$, some control over these properties is obtained.

The effect of varying the surface charge density will vary with the dopant beneath the interface. The surface charge generally acts as a positive field. Therefore, with a P-doped material beneath the interface, electrons will be drawn toward the interface, and in those situations where the surface charge density is high enough, an area directly below the interface may be inverted. Contrastingly, with N-doped silicon, the surface charge density will act to increase the electron density directly below the silicon-silicon dioxide interface, providing a more negative layer, but not an inverted layer.

The present invention is operative irrespective of the manner in which the silicon-silicon dioxide interface was formed and over a wide range of oxide thickness of about 0.1 to 0.6 $\mu$. Oxidation of the silicon may be carried out with either wet or dry oxygen, steam, by anodic oxidation, pyrolytic decomposition, etc. to thickness. Usually, dry oxidation will be carried out at a temperature of about 1,000°–1,250° C. for periods of time in the range of about 6 to 24 hours. By contrast, wet or steam oxidation will usually be carried out at temperatures of about 750°–1,250° C. for periods of time in the range of 5 minutes to 6 hours.

It is found that depending on the method of oxide formation used, the surface charge density will vary. Therefore, one way of obtaining different surface charge densities is by using different silicon oxide formation methods. However, to depend on the particular method for the desired surface charge density is cumbersome and inexact; it may frequently occur that no method provides the desired surface charge density or that the preferred method gives an unwanted surface charge density. Also some methods do not provide oxides which are stable under electric fields. By employing the present invention, an important adjunct to the production of devices having silicon-silicon dioxide interfaces is provided, permitting silicon to be oxidized in any manner and then bringing the surface charge density to the desired value by subsequent heat treatment in dry oxygen.

As indicated, the temperature used will be in the range of about 500°–1,250° C., though it will more usually be in the range of about 550°–1,000° C. The surface charge density increases with decreasing temperature. Therefore, if a lower surface charge density is desired, a higher temperature is required. Any convenient method may be used for heating the semiconductor device which permits proper control of the temperature and maintenance of a dry oxygen ambient. The semiconductor device should be held in a holder which permits cooling at the desired rate. When the embodiment of the invention employing rapid cooling is used, the holder should not retain so much heat as to retard cooling when the device is removed from the heated chamber. Otherwise, any convenient holder or any other means may be used to provide the heating environment and dry oxygen ambient.

The time required to achieve the desired result will vary inversely with the temperature used. Generally, about 5 minutes is required at 1,250° C., or about 90 minutes at about 500° C.; intermediate temperatures require intermediate times. The time required varies somewhat linearly with temperature. While longer times may be used at the lower temperatures, times in excess of those suggested should not be used at the higher temperatures, for the reason that temperatures in excess of 1,100° C. cause some migration of the dopant; where junctions exist between N and P dopants, the dopants may diffuse and cause the junctions to become soft or to be lost.

As already indicated, the surface charge density will generally be a characteristic of the temperature used. In order to obtain that particular surface charge density characteristic of a particular temperature, it is necessary to employ the embodiment employing rapid cooling. This is easily achieved by removing the device in less than a few seconds (15 seconds) from the heated chamber and placing it into an inert ambient at temperatures below 500° C., preferably below 350° C. However, when a device having a surface charge density characteristic of a temperature lower than that at which the device is heated is desired, it is necessary to employ the embodiment where the device is slowly removed from the chamber, and then allowed to cool slowly in oxygen. No specific times and variations in temperature can be taught; with any particular device, conditions can be arranged so that cooling occurs slowly and the surface charge density of a lower temperature is achieved. The slower the device is cooled, the further will be the surface charge density from that characteristic of the temperature at which the device was heated. Cooling times may vary from 1 minute or more up to 30 minutes: rates of cooling may vary from 1,000–30° C. per minute. As indicated, the particular heating temperature and rate of cooling will be a matter of determination in a particular situation with an individual semiconductor device, depending on the ultimate surface charge density desired and the convenience of the chosen conditions.

The oxygen annealing process is carried out prior to metallization and therefore, of course, prior to assembly of the device. The high annealing temperatures would result in a significant introduction of aluminum into the silicon as well as oxidation of the aluminum. The desirable results upon $Q_{ss}$ obtained by the oxygen annealing process of the invention are not affected significantly by subsequent metallization and assembly.

In order to demonstrate the effect of heating the semiconductor device at a temperature in the range of 500–1,250° C. in a dry oxygen ambient, a relatively simple device was prepared: metal-oxide-semiconductor device (MOS). The MOS device graphically demonstrates the variation which occurs in the properties of the device with the change in surface charge density caused by the variation in temperature.

The MOS device acts as a capacitor. In the MOS device, silicon dioxide acts as the dielectric portion of the capacitor between the substrate silicon and an evaporated aluminum film; the aluminum film is used for the field plate.

In preparing the MOS device used for evaluation, the material used was in the form of boron-doped ($C_B$=1.5×10[16] atoms/cc.), P-type circular slices of about 19–25 mm. in diameter, lapped on both sides to 250 microns. The slices were cleaned according to conventional procedures and etched to 150 microns thickness with a four parts hydrofluoric acid: ten parts nitric acid etching solution. After rinsing with water, the slice was oxidized in dry oxygen at 1,200° C. for sufficient time (approximately 60 minutes) to afford an oxide thickness of about 0.20 microns. Aluminum was deposited onto the silicon dioxide to provide approximately a 3,000–5,000 angstrom-thick aluminum layer, followed by removal of the silicon dioxide on the other side of the slice using conventional photoresist techniques. After removing the resist film, the aluminum layer was then reduced in size to 15 mil diameter dots by etching with a phosphoric acid etchant. A second aluminum layer of about 3,000–5,000 angstroms thickness was then deposited onto the back side of the slice. The entire slice was alloyed at 550° C. for 2 minutes in dry nitrogen. By comparing the capacitance-voltage relationship with that obtained by theoretical considerations, the surface charge density is determined by a method based on the theory originally proposed by Pfann and Garrett, Proc. IRE, 47 2011 (1959).

Devices prepared as described above were heated in oxygen at a variety of temperatures after the 1,200° C. oxidation and the resulting surface charge densities determined. Also, devices were similarly prepared which were phosphorous-doped ($C_B$=1.4×10[16] atoms/cc.), N-type MOS devices. The following table indicates the temperature, the time for which the devices were maintained at the temperature, the number of surface charges $Q_{ss}/q$, and the inversion voltage, $V_G(I)$. The $V_G(I)$ is the voltage at which the layer beneath the silicon-silicon dioxide interface is inverted. This value may be considered the turn-on voltage of the MOS diode.

TABLE I

| Oxygen Annealing | | P-Type | | N-Type | |
|---|---|---|---|---|---|
| Temp. °C | Time Min | $Q_{ss}/q$ (cm$^{-2}$ × 10$^{11}$) | $V_G(I)$ (volts) | $Q_{ss}/q$ (cm$^{-2}$ × 10$^{11}$) | $V_G(I)$ (volts) |
| 1250 | 2 | 2.3 | −0.1 | 1.4 | −3.2 |
| 1200 | 2 | 2.7 | −0.4 | 1.8 | −3.6 |
| 1100 | 5 | 3.8 | −1.4 | 2.7 | −4.4 |
| 1000 | 10 | 4.9 | −2.4 | 3.7 | −5.3 |
| 900 | 15 | 6.0 | −3.4 | 4.7 | −6.2 |
| 800 | 30 | 7.3 | −4.5 | 5.8 | −7.2 |
| 700 | 45 | 8.7 | −5.8 | 7.0 | −8.3 |
| 600 | 60 | 10.2 | −7.1 | 8.5 | −9.6 |
| 500 | 90 | 11.9 | −8.6 | 10.0 | −10.9 |

It is evident from the above data that wide variations in surface charge densities and turn-on voltages can be achieved by heat treating semiconductor devices at temperatures in the range of 500°–1,250° C. in a dry oxygen ambient for times sufficient to obtain the surface charge density characteristics of the particular temperature.

MOS devices prepared as described above were used to determine the effect of varying cooling rates. The devices used were boron-doped having a $C_B$=1.45×10[16] atoms/cc. The device was heated at 1,200° C. in a dry oxygen ambient for 60 minutes and then removed at different rates from the central portion of the furnace to the furnace edge. The following table indicates the time required for removing the slice from the center of the oven to the edge, the rate at which the slice was moved, the resulting surface charge density and concomitant inversion voltage.

TABLE II

| Cooling Time (Sec.) | Cooling Rate (In./Min.) | $Q_{ss}/q$ (cm$^{-2}$×10$^{11}$) | $V_G(I)$ (Volts) |
|---|---|---|---|
| 6 | 240 | 3.1 | -0.8 |
| 10 | 126 | 3.9 | -1.5 |
| 30 | 42 | 6.7 | 4.0 |
| 60 | 21 | 8.4 | 5.5 |
| 168 | 7.5 | 10.0 | 7.0 |
| 2040 | 0.62 | 10.9 | -7.9 |

It is evident from the above data that by heating at relatively high temperatures, that is temperatures at the upper limits of the indicated range, and then cooling relatively slowly (by slowly removing the device from the area maintained at the upper temperature) a wide range of increasing surface charge densities may be achieved. In this manner, time may be saved or other conveniences obtained by initially using a high temperature and then cooling slowly.

The above data demonstrate that surface charge densities of semiconductor devices can be readily controlled in a simple manner without detriment to the device. Irrespective of the method of oxidation, the present invention provides a method of variation of the surface charge density and those properties affected or controlled by the surface charge density. Thus, when preparing semiconductor devices, the method of oxidation need no longer control the surface charge density. Also, the present method provides a means for varying the properties of semiconductor devices to fit particular applications. In addition, when circuits require devices to have matched properties, the properties of one device or both devices may be varied to coincide with or complement one another.

It will be understood that the invention in its broader aspects is not limited to the specific examples described.

What is claimed is:

1. A method for varying the surface charge density $A_{ss}$ at a silicon-silicon dioxide interface of a semiconductor device which comprises heating the device prior to metallization at a temperature in the range of 1,250°to 500° C in a dry oxygen ambient for a time between 2 minutes and 90 minutes to provide, with a P-type semiconductor adjacent said interface, a surface charge density $Q_{ss}/q$ varying between 2.3×10[11] atoms/cm² to 11.9×10[11] atoms/cm² respectively and, with an N-type silicon adjacent said silicon-silicon dioxide interface, a surface charge density $Q_{ss}/q$ varying between 1.4×10[11] atoms/cm² and 10[12] atoms/cm², respectively;

cooling the device to a temperature below about 500° C; and then directly applying a metal layer to the device for making electrical contact thereto without further heating prior to applying said metal layer.

2. A method of claim 1 wherein said device is cooled to said temperature below about 500° C in less than about 15 seconds in order to obtain a surface charge density characteristic of the temperature at which the device was heated.

3. A method according to claim 1, wherein the resulting surface charge density $Q_{ss}$ is related to the time for heating the device and the temperature as given in the following table for both P- and N-type silicon:

| Oxygen Annealing | | P-Type | N-Type |
|---|---|---|---|
| Temp. °C. | Time Min. | $Q_{ss}/q$ $(cm^{-2}\times10^{11})$ | $Q_{ss}/q$ $(cm^{-2}\times10^{11})$ |
| 1,250 | 2 | 2.3 | 1.4 |
| 1,200 | 2 | 2.7 | 1.8 |
| 1,100 | 5 | 3.8 | 2.7 |
| 1,000 | 10 | 4.9 | 3.7 |
| 900 | 15 | 6.0 | 4.7 |
| 800 | 30 | 7.3 | 5.8 |
| 700 | 45 | 8.7 | 7.0 |
| 600 | 60 | 10.2 | 8.5 |
| 500 | 90 | 11.9 | 10.0 |

4. A method according to claim 1 wherein said cooling is carried out over a period of at least one minute in order to obtain a surface charge density characteristic of a temperature lower than that at which the device was heated.

5. A method according to claim 4, wherein the time in which the device is cooled to below 500° C. is in the range of 1 to 30 minutes.

6. A method according to claim 1 wherein the cooling times, cooling rates and resulting surface charge density are as follows:

| Cooling Time (Sec.) | Cooling Rate (In./Min.) | $Q_{ss}/q$ $(cm^{-2}\times10^{11})$ |
|---|---|---|
| 6 | 240 | 3.1 |
| 10 | 126 | 3.9 |
| 30 | 42 | 6.7 |
| 60 | 21 | 6.7 |
| 168 | 7.5 | 10.0 |
| 2,040 | 0.62 | 10.6 |

7. A method according to claim 1, wherein the silicon dioxide is prepared by oxidation of silicon with wet oxygen at a temperature in the range of 550°–1,200° C.

8. A semiconductor device prepared according to the method of claim 7.